(12) United States Patent
Chong et al.

(10) Patent No.: US 8,194,372 B1
(45) Date of Patent: Jun. 5, 2012

(54) SYSTEMS AND METHODS FOR ELECTROSTATIC DISCHARGE PROTECTION

(75) Inventors: Nui Chong, Cupertino, CA (US); Hong-Tsz Pan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 526 days.

(21) Appl. No.: 12/424,810

(22) Filed: Apr. 16, 2009

(51) Int. Cl.
*H02H 9/00* (2006.01)
(52) U.S. Cl. .......................................................... 361/56
(58) Field of Classification Search .................. 361/56
See application file for complete search history.

(56) References Cited

U.S. PATENT DOCUMENTS

| | | | | |
|---|---|---|---|---|
| 5,946,177 | A * | 8/1999 | Miller et al. | 361/56 |
| 5,955,763 | A * | 9/1999 | Lin | 257/355 |
| 6,327,126 | B1 * | 12/2001 | Miller et al. | 361/56 |
| 6,664,599 | B1 * | 12/2003 | Chen et al. | 257/355 |
| 2003/0214767 | A1 * | 11/2003 | Singh et al. | 361/56 |
| 2010/0157493 | A1 * | 6/2010 | Guedon et al. | 361/56 |

OTHER PUBLICATIONS

Ker, Ming-Dou, "Whole-Chip ESD Protection Design with Efficient VDD-to-VSS ESD Clamp Circuits for Submicron CMOS VLSI," *IEEE Transactions on Electron Devices*, Jan. 1999, pp. 173-183, vol. 46, No. 1.
Vashchenko, Vladislav A. et al., "Physical Limitation of the Cascoded Snapback NMOS ESD Protection Capability Due to the Non-Uniform Turn-Off," *IEEE Transactions on Device and Materials Reliability*, Jun. 2004, pp. 281-291, vol. 4, No. 2.

* cited by examiner

*Primary Examiner* — Ronald W Leja
(74) *Attorney, Agent, or Firm* — Kevin T. Cuenot; LeRoy D. Maunu

(57) ABSTRACT

A system for protecting an integrated circuit (IC) from electrostatic discharge (ESD) events includes a sensing circuit that detects an occurrence of an ESD event on one of a plurality of power supply rails of the IC and, in response, outputs an alert signal identifying the occurrence of the ESD event. The system includes a driver circuit that, responsive to receiving the alert signal, outputs an enable signal, and a cascaded switch. The cascaded switch includes first and second gates disposed upon a channel located between a drain of the cascaded switch coupled to a first power supply rail and a source of the cascaded switch coupled to a second power supply rail. Each of the two gates receives the enable signal and, responsive to the enable signal, the cascaded switch closes to establish a coupling between the first power supply rail and the second power supply rail.

18 Claims, 3 Drawing Sheets

SYSTEMS AND METHODS FOR ELECTROSTATIC DISCHARGE PROTECTION

FIELD OF THE INVENTION

The embodiments disclosed herein relate to integrated circuit (IC) devices. More particularly, the embodiments relate to protecting an IC from electrostatic discharge (ESD) events.

BACKGROUND

An electrostatic discharge (ESD) event refers to a temporary and abrupt flow of current between two objects of differing electrical potentials. ESD can be a serious issue for solid state electronic integrated circuits (ICs), as large potential changes and almost instantaneous current flows that occur during the ESD event can damage silicon junctions and oxide insulators. Typically, damage to an IC from the ESD event can diminish the performance of a silicon-based IC, or even render the IC unusable.

A buildup of charge on an object may occur for a variety of different reasons, many of which occur during the manufacturing and assembly of ICs. As a result, ICs may be subjected to inadvertent ESD events during assembly and prior to sale. To protect against ESD events, ESD protection schemes are implemented across the power supply rails of the IC. These ESD protection schemes typically include a clamping circuit that seeks to prevent the buildup of large electrical potentials within sensitive sections of the IC. In general, clamping circuits provide alternative pathways for a large current flow that may occur during the ESD event. These alternative pathways attempt to steer current around sensitive internal circuits, effectively bypassing the sensitive sections of the IC.

SUMMARY

The embodiments disclosed herein relate to integrated circuit devices (ICs) and, more particularly, to protecting circuits within an IC from electrostatic discharge (ESD) events. One embodiment of the present invention can include a system for protecting an IC from ESD events. The system can include a sensing circuit that detects an occurrence of an ESD event on at least one of a first power supply rail or a second power supply rail of the IC and, in response, outputs an alert signal identifying the occurrence of the ESD event. The system also can include a driver circuit coupled to the sensing circuit that, responsive to receiving the alert signal from the sensing circuit, outputs an enable signal, and a cascaded switch including a first gate and a second gate disposed upon a channel located between a drain of the cascaded switch coupled to the first power supply rail and a source of the cascaded switch coupled to the second power supply rail. Each of the two gates is coupled to the driver circuit and receives the enable signal therefrom. Responsive to the enable signal, the cascaded switch can close and establish a coupling between the first power supply rail and the second power supply rail of the IC.

The cascaded switch can be implemented as a metal oxide semiconductor field effect transistor (MOSFET) device. The MOSFET device can be implemented without drain ballasting. The MOSFET device also can be formed of a plurality of parallel-connected MOSFET devices, wherein each of the plurality of parallel-connected MOSFET devices is implemented as a dual-gate MOSFET device without drain ballasting.

In one aspect, the first gate and the second gate can be separated by a predetermined distance determined according to a reduced $\beta$ parameter of a parasitic bipolar transistor device associated with the cascaded switch, wherein the $\beta$ parameter decreases as the predetermined distance increases. In another aspect, a length of the channel can be a predetermined length that is determined according to a reduced $\beta$ parameter of the parasitic bipolar transistor device, wherein the $\beta$ parameter decreases as the length of the channel increases.

In another aspect, the first gate and the second gate can be separated by a predetermined distance determined according to a reduced snap-back voltage parameter of the parasitic bipolar transistor device, wherein the snap-back voltage decreases as the predetermined distance increases. In still another aspect, a length of the channel can be a predetermined length determined according to a reduced snap-back voltage parameter of the parasitic bipolar transistor device, wherein the snap-back voltage decreases as the length of the channel increases.

A length of at least one of the first gate or the second gate can be a predetermined length that is determined according to an amount of current the cascaded switch is to conduct during the ESD event.

Another embodiment of the present invention can include a method of protecting an IC from electrostatic discharge (ESD) events. The method can include providing a detector for detecting an occurrence of an ESD event on at least one of a first power supply rail or a second power supply rail of the IC and providing a cascaded switch. The cascaded switch can include a first gate and a second gate disposed in series upon a channel located between a drain of the cascaded switch coupled to the first power supply rail and a source of the cascaded switch coupled to the second power supply rail. Each of the two gates can receive an enable signal from the detector responsive to the ESD event and, responsive to the enable signal, the cascaded switch can close and establish a coupling between the first power supply rail and the second power supply rail of the IC.

Providing the cascaded switch can include implementing the cascaded switch as a MOSFET device. Providing the cascaded switch also can include implementing the MOSFET device without drain ballasting. In another aspect, providing the cascaded switch can include forming the MOSFET device of a plurality of parallel-connected MOSFET devices, wherein each of the plurality parallel-connected MOSFET devices is implemented as a dual-gate MOSFET device without drain ballasting.

Providing the cascaded switch can include separating the first gate and the second gate by a predetermined distance determined according to at least one of a reduced $\beta$ parameter or a reduced snap-back voltage of a parasitic bipolar transistor device associated with the cascaded switch, wherein the $\beta$ parameter and the snap-back voltage decrease as the predetermined distance increases.

Providing the cascaded switch can include setting a length of the channel to a predetermined length according to at least one of a reduced $\beta$ parameter or a reduced snap-back voltage of a parasitic bipolar transistor device associated with the cascaded switch, wherein the $\beta$ parameter and the snap-back voltage decrease as the predetermined length increases.

Providing the cascaded switch further can include setting a length of at least one of the first gate or the second gate to a predetermined length determined according to an amount of current the cascaded switch is to conduct during the ESD event.

Another embodiment of the present invention can include a computer-usable medium including computer-usable program code that, when executed by a computer, implements a system for protecting an IC from ESD events. The computer-usable medium can include computer-usable program code that implements the various structures and functions described within this specification.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely example implementations of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed within this specification relate to electrostatic discharge (ESD) protection for an integrated circuit device (IC). More particularly, the embodiments provide an ESD protection system and method. In accordance with the inventive arrangements disclosed herein, an ESD protection system can provide ESD protection from an ESD event occurring at the power supply rails of the IC. As devices within the IC may be vulnerable to ESD events, the ESD protection system can protect the devices from damage or destruction caused by the ESD event.

The ESD protection system can include a sensing circuit that detects an occurrence of the ESD event and outputs a signal alerting a driver circuit of the ESD event. Responsive to detecting the alert signal, the driver circuit can change logic states, thereby closing a cascaded switch that spans the two power supply rails of the IC. In this manner, the current associated with the ESD event can be bypassed, through the cascaded switch, away from vulnerable devices within the IC. Operation of the ESD protection system can limit the maximum voltage potential that appears across the power supply rails, and thus, the devices, within the IC.

The embodiments disclosed within this specification can be implemented within a variety of different types of ICs, whether custom ICs, application specific integrated circuits (ASICs), mixed signal ICs, or programmable ICs, for example.

Figure 1:
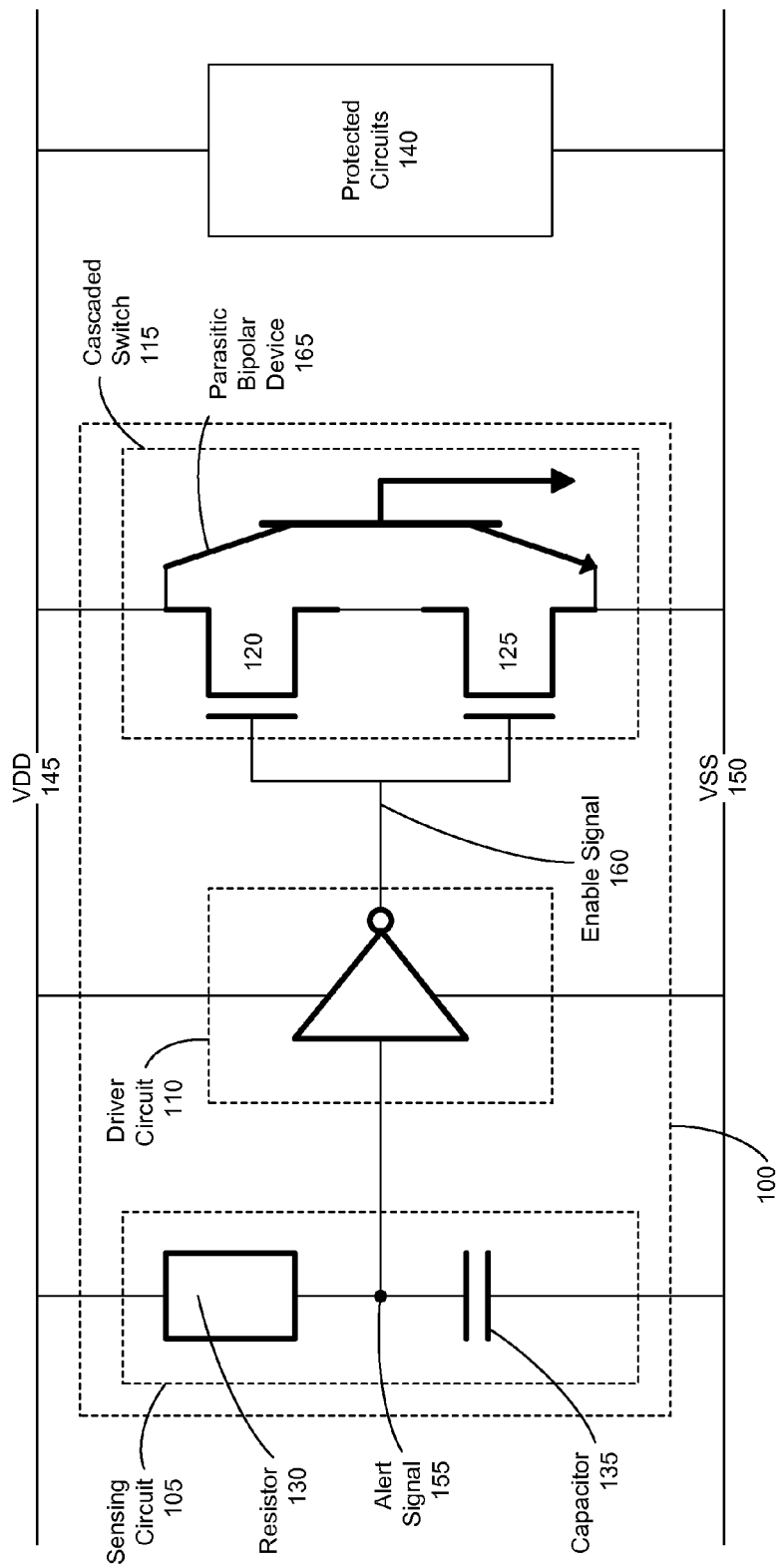
FIG. 1 is a circuit diagram illustrating an electrostatic discharge (ESD) protection circuit for use within an integrated circuit (IC), in accordance with one embodiment of the present invention.

FIG. 1 is a circuit diagram illustrating an ESD protection system 100 for use within an IC, in accordance with one embodiment of the present invention. ESD protection system 100 can provide improved ESD protection from ESD events occurring on power supply rail VDD 145 and power supply rail VSS 150 of the IC. As noted, these types of ESD events can affect devices within the IC, such as protected circuits 140. As used within this specification, the phrase "power supply rail," refers to any one of a pair of complimentary power supplies or power supply wires that can be routed in metal throughout an IC. A complementary pair of power supply rails such as VDD 145 and VDD 150 provide two differing voltage potentials capable of operating electronic circuits implemented within the IC.

In general, VDD 145 and VSS 150 are coupled to external pins of the IC. As VDD 145 and VSS 150 can be contacted external to the IC package, VDD 145 and VSS 150, as well as any circuits attached to VDD 145 and VSS 150, may be vulnerable to ESD events. ESD protection system 100 can be coupled between VDD 145 and VSS 150 to provide ESD protection to protected circuits 140. In one embodiment, ESD protection system 100 is implemented as a clamp circuit.

The same reference characters are used herein to refer to terminals, signal lines, wires, nodes, and their corresponding signals. In this regard, the terms "signal," "wire," "connection," "terminal," "node," and "pin" may be used interchangeably, from time-to-time, within this specification.

Protected circuits 140 can be any circuit, plurality of circuits, device, or plurality of devices within the IC that are coupled to VDD 145 and VSS 150 and, as such, requires ESD protection. For example, protected circuits 140 can include programmable logic, dedicated processing blocks, or any other part of a user circuit design requiring or benefiting from ESD protection.

ESD protection system 100 can include a sensing circuit 105, a driver circuit 110, and a cascaded switch 115. Each of sensing circuit 105, driver circuit 110, and cascaded switch 115 can be coupled to VDD 145 and VSS 150. In one embodiment, each of sensing circuit 105, driver circuit 110, and cascaded switch 115 are directly connected to VDD 145 and VSS in the manner pictured in FIG. 1.

As shown, sensing circuit 105 can be coupled to driver circuit 110 through an alert signal 155. Sensing circuit 105 can detect ESD events occurring on either VDD 145 or VSS 150. Responsive to detecting an ESD event, sensing circuit 105 can output alert signal 155 indicating that an ESD event has been detected on VDD 145, VSS 150, or both.

In one embodiment, sensing circuit 105 is implemented as a series-connected passive resistor-capacitor (RC) network including a resistor 130 and a capacitor 135. Alert signal 155 is generated by, and thus refers to, the node connecting resistor 130 with capacitor 135. By adjusting the resistance of resistor 130 and the capacitance of capacitor 135, the frequency and duration of the ESD event to be detected can be controlled. The component values of resistor 130 and capacitor 135 further determine the length of time that alert signal 155 is generated by sensing circuit 105 subsequent to the ESD event. It will be clear to those of skill in the art that, although illustrated as an RC network in FIG. 1, sensing circuit 105 can be implemented as any of variety of circuits capable of sensing an ESD event and outputting alert signal 155. As such, sensing circuit 105 is not intended to be limited to the example provided.

Driver circuit 110 is coupled to cascaded switch 115 through an enable signal 160. Accordingly, driver circuit 110 receives alert signal 155 indicating the occurrence of an ESD event and, in response, outputs enable signal 160 to cascaded switch 115. Driver circuit 110 can be implemented to provide a positive, negative, or unity gain, depending upon the polarity and form of alert signal 155. Driver circuit 110 can be implemented as any of a variety of circuits capable of receiving a single ended signal such as alert signal 155 and increasing the drive capability of that signal to generate enable signal 160, which can drive the metal oxide semiconductor field effect transistor (MOSFET) devices forming cascaded switch 115.

For example, driver circuit 110 can be implemented as a cascaded series of complimentary metal oxide semiconductor (CMOS) inverters. Each of the CMOS inverters can be sized as a progressively larger device, thereby generating enable signal 160 from the last CMOS inverter that is capable of efficiently switching cascaded switch 115. Although illustrated as a CMOS inverter within this specification, driver circuit 110 can be implemented as any of variety of circuits capable of receiving alert signal 155 and outputting enable signal 160. As such, driver circuit 110 is not intended to be limited to the example provided.

Cascaded switch 115 can be implemented with one or more MOSFET devices. Cascaded switch 115 can be sized according to the quantity of current expected to flow though cascaded switch 115 during the ESD event. Accordingly, the larger the area of cascaded switch 115, the larger the amount of current that may be accepted by cascaded switch 115 during an ESD event.

As shown, cascaded switch 115 is represented as two series-connected MOSFET devices 120 and 125. In another embodiment, cascaded switch 115 is constructed as a single device having two gate terminals to be described in greater detail with reference to the remaining figures. A dual-gate device exhibits behavioral characteristics similar to those of the implementation of cascaded switch 115 pictured in FIG. 1, i.e., with series-connected MOSFET devices 120 and 125. For example, the spacing, or distance, between the gates of the dual-gate device can be varied to prevent a parasitic lateral bipolar junction transistor (parasitic BJT) from conducting current during the ESD event. An exemplary parasitic BJT is depicted as parasitic bipolar device 165, contained within, or inherent to, cascaded switch 115.

In the steady state, capacitor 135 collects charge until the voltage level of alert signal 155 is approximately equal to the voltage level of VDD 145. As driver circuit 110 can have a gain of negative one and the voltage level of alert signal 155 can be equal to VDD 145, for example, enable signal 160 can be approximately equal to VSS 150. When enable signal 160 takes on a voltage of approximately VSS 150, cascaded switch 115 is disabled, as the gate-to-source voltage of cascaded switch 115 is approximately equal to zero. Accordingly, cascaded switch 115 appears as an open circuit, thereby rendering VDD 145 and VSS 150 as separate electrical nodes.

During a transient event, such as an ESD event, capacitor 135 attempts to maintain the voltage differential established during the steady state between alert signal 155 and VSS 150. As a result, a sufficiently large ESD event occurring on VDD 145 or VSS 150 creates a voltage differential between VDD 145 and alert signal 155 sufficient to switch the output voltage of driver circuit 110 and, therefore, of enable signal 160, to approximately that of VDD 145. Sensing circuit 105 can be designed to output alert signal 155 in an appropriate period of time subsequent to the onset of the ESD event to assure that cascaded switch 115 reacts in a timely manner to shunt the current, thereby protecting protected circuits 140 from the ESD event. Alert signal 155 can remain active for a sufficient period of time subsequent to the detected ESD event to allow the ESD current generated by the ESD event to fully dissipate.

The application of enable signal 160 to cascaded switch 115, when enable signal 160 is approximately equal to VDD 145, enables cascaded switch 115, thereby closing cascaded switch 115. Closing cascaded switch 115 establishes a coupling between VDD 145 and VSS 150.

In this manner, cascaded switch 115 provides a bypass path for current associated with the ESD event. Cascaded switch 115 shunts, or routes, current around protected circuits 140 when closed. Closing cascaded switch 115 can prevent the voltage differential between VDD 145 and VSS 150 from exceeding a predetermined maximum voltage differential. ESD protection system 100 can be designed so that the predetermined maximum voltage differential is not exceeded. Accordingly, when cascaded switch 115 closes, ESD protection system 100 prevents protected circuits 140 from being damaged by the occurrence of excessive voltage potentials across VDD 145 and VSS 150 during the ESD event.

As previously described, parasitic bipolar device 165 represents a parasitic BJT that is inherent in the structure of a MOSFET device. MOSFET devices are typically designed to minimize the ability of the parasitic BJT to function during normal operation of the MOSFET device within an electronic circuit. Methods can be implemented within modern CMOS manufacturing processes to reduce the body resistance of the MOSFET device and the $\beta$ of the parasitic BJT. Reducing the body resistance of the MOSFET and the $\beta$ of the parasitic BJT can reduce the possibility that the parasitic BJT will become operable to conduct current during normal operation of the MOSFET device within an electronic circuit.

As used within this specification, "snap-back voltage" refers to a minimum voltage potential that, when applied across the parasitic BJT, can enable the parasitic BJT. Also, as used within this specification, "$\beta$" refers to the current gain of a BJT or the ratio of collector current to base current of the BJT when the BJT is in a linear region of operation. The term $\beta$ can indicate the quality of a BJT as an electronic device and the ability of a parasitic BJT to act as a current handling device. Typically, the larger the $\beta$ parameter of the parasitic BJT within a MOSFET, the more likely the MOSFET will experience bipolar snap-back and the lower the snap-back voltage required to enable the parasitic BJT.

Many conventional ESD protection circuits operate by deliberately triggering the parasitic BJT as the main discharge path for an ESD event. In these types of ESD protection circuits, particularly ESD clamp circuits, the large current-carrying capacity of the parasitic BJT can allow smaller sized MOSFET devices to be used as switches within the ESD clamp circuit to bypass the ESD current. The smaller MOSFET devices require a lesser amount of area. However, a disadvantage of these types of ESD clamp circuits is that the snap-back voltage level needed to enable the parasitic BJT can be too high to protect delicate circuits within the IC from damage during the ESD event.

Other varieties of conventional ESD protection circuits, e.g., ESD clamp circuits, use larger MOSFET devices. Such ESD protection circuits use the current driving capability of the MOSFET device in saturation mode and seek to prevent the parasitic BJT from activating during the ESD event. In such circuits, the voltage necessary to trigger the ESD clamp can be lower than the breakdown voltage of the parasitic BJT. The lower breakdown voltage can enhance protection to delicate circuits within the IC during the ESD event. However, larger MOSFET devices require significantly more area on the IC.

Whether an ESD protection circuit is implemented with the intention of suppressing or enabling the parasitic BJT inherent within the MOSFTET device(s), any enabling of the parasitic BJT during an ESD event can result in damage to the MOSFET devices of the ESD protection circuit. Typically, ballasting resistors are used within MOSFET devices to reduce the likelihood of damage should the parasitic BJT be driven into bipolar snap-back during the ESD event. However, the addition of ballasting resistors can result in large area increases in the layout of the ESD protection circuit. The larger ESD protection circuit can lead to increased IC size and cost.

Within conventional ESD protection circuits, a single-gate MOSFET device is typically used as a switch to bypass ESD current and couple VDD 145 to VSS 150. In the case of a single-gate MOSFET device switch, the parasitic BJT inherent in that device can become operable during an ESD event. The high voltage potentials and currents that occur during ESD events can "turn on" the parasitic BJT and trigger bipolar snap-back. When bipolar snap-back occurs, the parasitic BJT can supersede the conventional current path provided by the MOSFET device, e.g., from a drain terminal through the device channel and out of a source terminal of the MOSFET, as the major current handling path for the ESD protection circuit during the ESD event. Bipolar snap-back is a poorly controlled event and, as such, can lead to excessive device currents capable of damaging the single-gated MOSFET device switch. Damage to the single-gated MOSFET device switch can result in an ESD protection circuit that is incapable of handling more than one ESD event.

In accordance with the embodiments of the present invention, unlike the single-gate MOSFET device switch, cascaded switch 115 can include two or more gates arranged in series. Implementing cascaded switch 115 with two or more gates in series can degrade the performance of parasitic bipolar device 165, thereby reducing the probability of bipolar snap-back occurring in cascaded switch 115 during an ESD event. As a result, the probability of damage to cascaded switch 115 during an ESD event can be reduced, allowing ESD protection system 100 to remain functional for multiple ESD events.

It should be a appreciated that the different circuit components represented in FIG. 1, while shown as single devices, each may be implemented using a plurality of such devices coupled in parallel to effectuate different characteristics, such as outputting a signal with greater drive capability, or allowing the device to handle greater current flows. For example, driver circuit 110 is illustrated as a single inverter. As noted, driver circuit 110 can be implemented as a plurality of inverters, e.g., inverter stages, in series. Each inverter stage can be implemented as one or more inverters configured in parallel to effectuate greater drive capability, e.g., to output enable signal 160 with greater drive capability. Each stage can be implemented with an increasing number of inverters arranged in parallel, for example.

Similarly, resistor 130 and/or capacitor 135 may be implemented as a plurality of resistors or capacitors, respectively. Each of MOSFET devices 120 and 125 may also be implemented as a plurality of parallel-connected MOSFET devices. In this manner, cascaded switch 115 may be implemented with a plurality of dual-gate devices arranged in parallel, as will be described with reference to FIG. 2.

Figure 2:
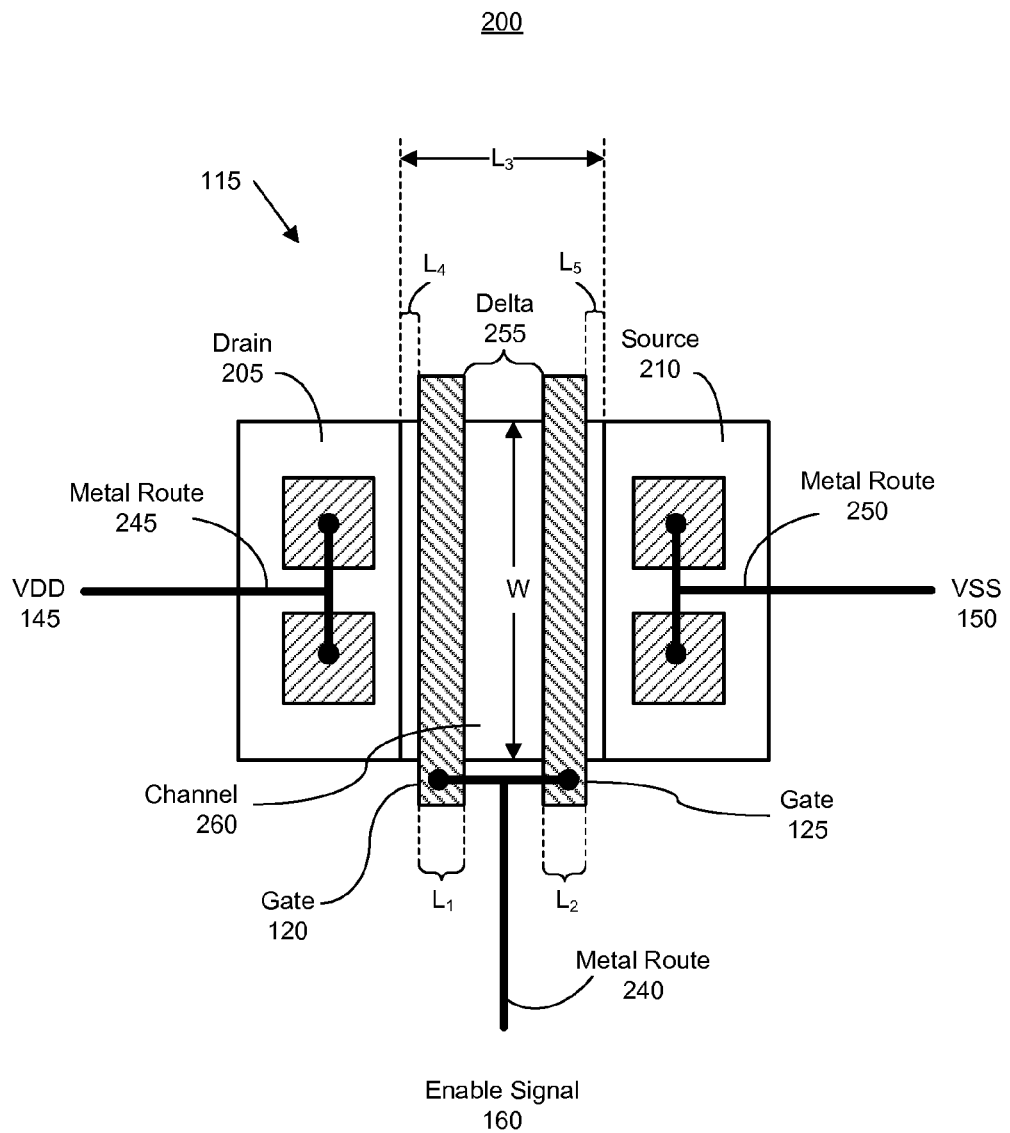
FIG. 2 is a block diagram illustrating a layout of a cascaded switch, in accordance with another embodiment of the present invention.

FIG. 2 is a block diagram illustrating a layout 200 of cascaded switch 115 described with reference to FIG. 1, in accordance with another embodiment of the present invention. As used within this specification, a "layout" or "IC layout," refers to a representation of an IC in terms of planar geometric shapes that correspond to the design masks that pattern the metal layers, the oxide regions, the diffusion areas, and/or other layers that make up devices of the IC. Layout 200 illustrates an embodiment of cascaded switch 115 implemented with a dual-gate MOSFET device.

As noted, reference characters 120 and 125 indicated MOSFET devices within FIG. 1. Within FIG. 2, each of reference characters 120 and 125 references one of the two gates of the pictured dual-gate device.

Cascaded switch 115, though implemented as a single, dual-gated MOSFET device, can function, or behave, as two separate MOSFET devices coupled in series. As pictured in FIG. 2, cascaded switch 115 includes a single drain 205 having a single terminal accessed through a metal route 245, and a single source 210 having a single terminal accessed through a metal route 250. As such, cascaded switch 115 can be considered a single, physical MOSFET device. When considered as an electronic switch, however, the dual-gate structure of cascaded switch 115 allows cascaded switch 115 to behave as two series-connected MOSFET devices. Each of gates 120 and 125 of cascaded switch 115 can be individually controlled and, as such, provide a means of enabling or disabling current flow through cascaded switch 115. Accordingly, cascaded switch 115 can be represented functionally, or electronically, as two series-connected MOSFET devices, e.g., as illustrated in FIG. 1.

Metal route 245 connects drain 205 to VDD 145. Metal route 250 connects source 210 to VSS 150. Metal route 240 connects gates 120 and 125 to enable signal 160. In this manner, responsive to enable signal 160 being approximately equal to the voltage at VDD 145, cascaded switch 115 is enabled, creating a current path from VDD 145 to VSS 150.

In conventional ESD clamp circuits, a single-gated MOSFET device is typically used as a switch connected across VDD 145 and VSS 150. The switch is usually implemented with a large, single-gated MOSFET device in order to provide a low resistance switch with high current handling capability. A large MOSFET device has a large width relative to its length and, as such, can be difficult to integrate within an IC layout. Accordingly, a single-gated MOSFET device switch is typically implemented as a series of smaller parallel-connected devices or as a multi-fingered MOSFET device. Using this approach, the single-gated MOSFET device switch can be implemented with a more balanced length-to-width ratio that can be more easily integrated within an IC layout.

When the single-gated MOSFET device switch is implemented with two or more parallel MOSFET devices or a multi-fingered MOSFET device, however, each individual device or finger contains a parasitic BJT. Each single-gated MOSFET device, therefore, can be modeled to contain a parasitic BJT connected in parallel to the MOSFET device. Taking a larger perspective of the entire switch, the switch can be modeled as two or more MOSFET devices connected in parallel with a parasitic BJT connected in parallel with each of the two or more MOSFET devices. As no IC manufacturing process is ideal, the parasitic BJTs associated with the single-gated MOSFET device switch will have non-uniform performance characteristics with respect to $\beta$, snap-back voltage, and the like. During the ESD event, each parasitic BJT in the single-gated MOSFET device switch will have differing snap-back voltage characteristics. Accordingly, particular parasitic BJTs within the single-gated MOSFET device switch will be more prone to initiating bipolar snap-back during an ESD event than others, making it difficult to reliably predict the behavior of the switch.

When an ESD event initiates bipolar snap-back in a particular parasitic BJT of the single-gated MOSFET device switch, self-heating within the parasitic BJT will result from the ESD current flow through the parasitic BJT. This self-heating can have a positive feedback effect on the particular parasitic BJT in snap-back. The positive feedback can create a cycle of increasing current levels in the particular parasitic BJT. This cycle can continue until the parasitic BJT in snap-back fails, thereby damaging the individual MOSFET device or device finger with which the failed parasitic BJT is associated.

In order to avoid this failure event, resistance is added to the drain terminal of each individual MOSFET device or device finger in the single-gated MOSFET device switch. The resistance can be added with an individual resistor at the drain and/or source or, more typically, with the "ballasting" of the device. As used within this specification, "ballasting" refers to increasing a distance between the drain connection and the gate edge of a MOSFET device. A silicided metal layer is also blocked or removed from the increased spacing between the drain edge and the gate edge in the MOSFET device. The silicide block requires an additional process step during the IC manufacturing process. The lack of metal silicide in the extra spacing between the drain and gate edge increases the drain resistance associated with each ballasted MOSFET device or device finger.

The additional drain resistance from ballasting creates a voltage drop at the drain terminal of each MOSFET device or device finger that increases as the ESD current increases during snap-back. The voltage drop forces the voltage across the parasitic BJT associated with a particular device drain to go lower, thereby making snap-back more difficult to maintain. The drain resistance prevents ESD current from crowding into particular devices or fingers of the single-gated MOSFET device switch in an unbalanced way as more current in a particular parasitic BJT forces the voltage across that parasitic BJT lower. In this manner, each MOSFET device or device finger in the single-gate MOSFET device switch can be protected from excessive current damage. Additionally, the single-gate MOSFET device switch can be protected from failure caused by current crowding associated with bipolar snap-back by a singular ESD event.

Ballasting, however, can require significant layout area to implement. For example, in a typical modern IC manufacturing process, e.g., a 65 nm process, 2-4 μm of channel spacing is required for each ballasted resistor added to a MOSFET device. As such, ballasting can more than double the layout area required for the ballasted MOSFET device compared to a MOSFET device layout without ballasting. The increased channel spacing required for ballasting increases the drain-to-well junction area of the ballasted MOSFET device.

Another disadvantage of single-gated MOSFET device switches relates to leakage current. Non-idealities of MOSFET devices as switches can lead to a MOSFET device leaking current even when the switch is open. As the switch is connected across the power supply rails of the IC, power will be consumed whenever there is a voltage potential differential between the two power supply rails. The increased well junction area from ballasting can further contribute to increased levels of leakage current when a ballasted MOSFET device is disabled.

By comparison, cascaded switch 115 does not unnecessarily dissipate current whenever the IC is in a power up mode. Each of gates 120 and 125 has a length, denoted as $L_1$ and $L_2$ respectively. Gates 120 and 125 is disposed upon, i.e. overlays, a P-type conducting channel 260 of cascaded switch 115. Gates 120 and 125 can be vertically separated from channel 260 by a layer of gate oxide. Channel 260 can be physically defined as the P-type area residing between the n-type regions of drain 205 and source 210. Channel 260 has a channel length denoted as $L_3$, as shown in FIG. 2.

The spacing, or distance, between gates 120 and 125 is represented within FIG. 2 as delta 255. Delta 255 can affect the β parameter, as well as the snap-back voltage parameter, of the parasitic BJT inherent to cascaded switch 115. As delta 255 is increased, the β parameter and snap-back voltage parameter of the parasitic BJT associated with cascaded switch 115 can be decreased.

As shown, each of gates 120 and 125 does not extend to the edge of channel 260. The placement of gate 120 leaves an exposed portion of channel 260 to the left of gate 120, extending to drain 205, and having a length $L_4$. The placement of gate 125 leaves another exposed portion of channel 260 to the right of gate 125, extending to source 210, and having a length of $L_5$. Although lengths $L_4$ and $L_5$ influence channel length $L_3$, lengths $L_4$ and $L_5$ are in general determined by the particular manufacturing process used to implement, or fabricate, cascaded switch 115. Depending upon the implementation technology used, the exposed portions of channel 260 between gate 120 and drain 205 and between gate 125 and source 210 will have varying lengths or may not exist at all, e.g., be covered by gates 120 and 125.

Increasing lengths $L_1$ and $L_2$ of gates 120 and 125 respectively, and delta 255 between gates 120 and 125, whether individually or in combination, serves to widen the channel length $L_3$ of cascaded switch 115. Increasing $L_3$ increases the base of the parasitic bipolar device associated with cascaded switch 115. Increasing the base of the parasitic bipolar device decreases β and the snap-back voltage of that parasitic bipolar device. This decreases the likelihood of snap-back occurring within cascaded switch 115 during an ESD event.

It should be appreciated that the area required to implement cascaded switch 115, even with the increased channel length $L_3$ associated with increased gate lengths $L_1$, $L_2$, and delta 255, is still significantly smaller than the area needed were the device to be ballasted. For example, in a 65 nm process, the channel length of cascaded switch 115 can be in the 0.2 to 0.5 μm range. By comparison, the channel length of a ballasted MOSFET device may range from 2 to 5 μm. These values are provided for purposes of illustration only, to demonstrate the area savings that may be achieved with the embodiments described herein, where no ballasting is needed compared to conventional technologies that do require ballasting. As such, the exemplary ranges and values are not intended to limit the embodiments to any one particular range or set of values.

Accordingly, bipolar snap-back and current crowding in MOSFET devices associated with cascaded switch 115 can be prevented without ballasting the MOSFET devices. In this manner, the layout area consumed by cascaded switch 115 can be reduced from the layout area consumed by a single-gated MOSFET device switch. Additionally, the probability of damage from bipolar snap-back and current crowding to cascaded switch 115 during an ESD event can be reduced.

Changing the gate lengths $L_1$ and $L_2$ can affect the drive current capability of cascaded switch 115. Decreasing the gate lengths $L_1$ and $L_2$ increases the drive current capability of cascaded switch 115 when operated in the linear region. Increased drive current improves the ability of cascaded switch 115 to dissipate ESD current generated during an ESD event.

The dual-gate structure of cascaded switch 115, as illustrated in layout 200, provides improved performance with respect to leakage current. Since the dual-gates are in series, each of gates 120 and 125 serves to block, and therefore reduce, leakage current though cascaded switch 115 when disabled. As such, leakage current and power consumption by an IC including the embodiments described herein are both reduced.

For purposes of illustration, layout 200 is shown as being implemented using an NMOS device. It should be appreciated, however, that the embodiments described within this specification can be implemented using other varieties of MOSFET devices. As such, the examples disclosed herein are not intended to be limiting, but rather are provided to convey a more complete understanding of the embodiments described.

In this regard, it should also be appreciated that cascaded switch 115 can be implemented with a plurality of devices, each configured as described with reference to FIG. 2, where each of the plurality of devices is arranged in parallel. Further, in such an arrangement, each of the plurality of parallel-connected devices can be implemented without ballasting.

Figure 3:
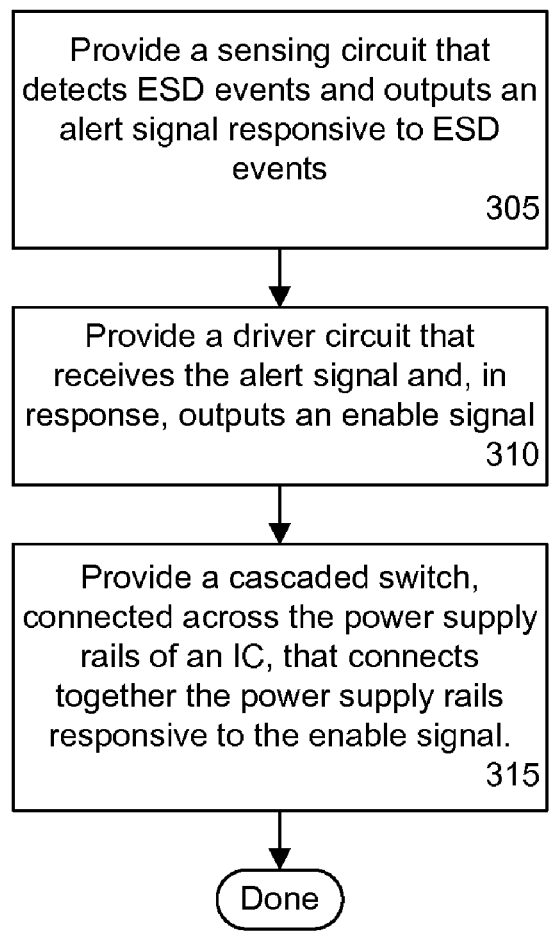
FIG. 3 is a flow chart illustrating a method of providing ESD protection to an IC, in accordance with another embodiment of the present invention.

FIG. 3 is a flow chart illustrating a method 300 of providing ESD protection to an IC in accordance with another embodiment of the present invention. More particularly, method 300 describes a technique for protecting one or more circuits within the IC from an ESD event occurring on power supply rails supplying the protected circuit(s).

Accordingly, in step 305, a sensing circuit is provided that detects an ESD event on either of two power supply rails of an IC. Responsive to detecting the ESD event, the sensing circuit outputs an alert signal identifying an occurrence of the ESD event. For example, the sensing circuit can be designed to detect when the ESD event creates a voltage potential across the power supply rails of the IC that exceeds a predetermined maximum voltage potential as measured between the power supply rails of the IC. Responsive to the predetermined maximum voltage potential being exceeded, the alert signal can be output. Additionally or alternatively, the sensing circuit can be configured to output an alert signal only when the predetermined maximum voltage potential is exceeded for a predetermined amount of time.

For example, a 200 mV noise signal may be present on a power supply rail. In that case, the predetermined maximum voltage potential can be set greater than 200 mV, e.g., through adjusting the resistance and capacitance values of the sensing circuit. In this manner, the noise will not be detected as an ESD event and generate a false alert signal.

In another example, a protected circuit may be able to withstand a 3 volt potential across the power supply rails, but be damaged by a voltage potential exceeding 5 volts. In that case, the sensing circuit can output an alert signal whenever an ESD event causes a voltage potential greater than 5 volts across the power supply rails, without regard for the amount of time that the predetermined maximum voltage potential is exceeded.

In still another example, the predetermined period of time for the existence of the ESD event can be set to some value such as be 5 μS. In that case, an ESD event that lasts only 3 μS would not result in the output of an alert signal. As noted, the values provided within this specification are intended as examples to illustrate aspects of the embodiments of the present invention. The examples are not intended to be limiting or suggest that only a particular set of values is to be used.

In step 310, a driver circuit is provided that receives the alert signal. As the alert signal can vary in terms of level and form depending upon the type of sensing circuit implemented, the driver circuit can be implemented to detect the particular alert signal output by the sensing circuit. Additionally, the driver circuit converts the alert signal to an enable signal capable of driving a cascaded switch.

Typically the sensing circuit, e.g. a passive network, is not designed to drive a large capacitive load such as the cascaded switch. In that case, the driver circuit may present a small input load to the sensing circuit. The driver circuit outputs an enable signal capable of driving the capacitive loads presented by the gate terminals of MOSFET devices implemented within the cascaded switch. Additionally, the driver circuit can switch the gate terminals of the MOSFET devices in a time period subsequent to the ESD event that assures the cascaded switch closes before the ESD event can generate a voltage potential across the power supply rails sufficient to damage the protected circuits.

In step 315, a cascaded switch is provided that is coupled across the power supply rails of the IC. The cascaded switch is implemented with one or more MOSFET devices coupled in series. Each MOSFET device within the cascaded switch can be implemented with dual-gate terminals. The enable signal is input to each gate terminal of the cascaded switch. Responsive to receiving the enable signal, the cascaded switch is closed. Closing the cascaded switch couples together the power supply rails of the IC, thereby preventing excessive voltage potentials from appearing across the power supply rails and/or the protected circuit.

The MOSFET devices can be sized according to a predetermined quantity of ESD current to be bypassed around the protected circuits, by the cascaded switch, during the ESD event. Additionally, the sizing of the MOSFET devices can determine the "on" resistance, e.g., $R_{on}$, of the closed cascaded switch. The distance between the dual-gates in each MOSFET device, and the channel length of each MOSFET device, within the cascaded switch can be adjusted to determine a $\beta$ parameter and a snap-back voltage parameter of a parasitic BJT inherent within the structure of each MOSFET device. Increasing the spacing between the gates and the overall channel length can decrease the $\beta$ parameter and snap-back voltage parameter of the parasitic BJT, thereby reducing the probability that the MOSFET will be driven into snap-back during the ESD event. As noted, the length of each gate in the cascaded switch further can be adjusted to allow a level of current through the cascaded switch sufficient to dissipate a predetermined quantity of ESD current generated by an ESD event.

The embodiments disclosed herein provide systems and methods for protecting circuits from ESD events within an IC. In accordance with the inventive arrangements, a dual-gate MOSFET device can be used to implement a cascaded switch. The cascaded switch provides improved protection from ESD events compared to conventional ESD clamp circuits. The ESD protection that is achieved is more resilient to parasitic BJT effects inherent in MOSFET devices and reduces leakage current under normal operation conditions, e.g., in the absence of an EDS event.

The flowchart in the figures illustrates the architecture, functionality, and operation of possible implementations of systems, methods, and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A system for protecting an integrated circuit (IC) from electrostatic discharge (ESD) events, the system comprising:
    a sensing circuit that detects an occurrence of an ESD event on at least one of a first power supply rail or a second power supply rail of the IC and, in response, outputs an alert signal identifying the occurrence of the ESD event;
    a driver circuit coupled to the sensing circuit that, responsive to receiving the alert signal from the sensing circuit, outputs an enable signal; and
    a cascaded switch comprising a first gate and a second gate adjacent to the first gate, wherein the first and second gates are disposed upon a channel located between a drain of the cascaded switch coupled to the first power supply rail and a source of the cascaded switch coupled to the second power supply rail, wherein each of the first and second gates is coupled to the driver circuit and receives the enable signal therefrom, and wherein, responsive to the enable signal, the cascaded switch closes and establishes a coupling between the first power supply rail and the second power supply rail of the IC;
    wherein:
        the first gate and the second gate of the cascaded switch comprise at least one dual-gated metal oxide semiconductor field effect transistor (MOSFET) device;
        the drain is a single drain of the dual-gated MOSFET device;
        the source is a single source of the dual-gated MOSFET device; and
        the channel is a single channel of the dual-gated MOSFET device.

2. The system of claim 1, wherein the MOSFET device is implemented without drain ballasting.

3. The system of claim 1, wherein the MOSFET device comprises a plurality of parallel-connected MOSFET devices, wherein:
    each of the plurality of parallel-connected MOSFET devices is implemented as a dual-gate MOSFET device without drain ballasting, and each of the parallel-connected MOSFET devices has a respective first gate, a respective second gate, a respective channel, a respective source, and a respective drain;
    each respective drain is a single drain of one of the parallel-connected MOSFET devices;
    each respective source is a single source of one of the parallel-connected MOSFET devices; and
    each respective channel is a single channel of one of the parallel-connected MOSFET devices.

4. The system of claim 1, wherein the first gate and the second gate are separated by a predetermined distance determined according to a reduced parameter of a parasitic bipolar transistor device associated with the cascaded switch, wherein the parameter decreases as the predetermined distance increases.

5. The system of claim 1, wherein the first gate and the second gate are separated by a predetermined distance determined according to a reduced snap-back voltage parameter of a parasitic bipolar transistor device associated with the cascaded switch, wherein the snap-back voltage decreases as the predetermined distance increases.

6. The system of claim 1, wherein a length of the channel is a predetermined length determined according to a reduced snap-back voltage parameter of a parasitic bipolar transistor device associated with the cascaded switch, wherein the snap-back voltage decreases as the length of the channel increases.

7. The system of claim 1, wherein the first gate and the second gate are not separated by another node of the cascaded switch.

8. A method of protecting an integrated circuit (IC) from electrostatic discharge (ESD) events, the method comprising:
    providing a detector for detecting an occurrence of an ESD event on at least one of a first power supply rail or a second power supply rail of the IC; and
    providing a cascaded switch comprising a first gate and a second gate adjacent to the first gate, wherein the first and second gates are disposed in series upon a channel located between a drain of the cascaded switch coupled to the first power supply rail and a source of the cascaded switch coupled to the second power supply rail, wherein each of the first and second gates receives an enable signal from the detector responsive to the ESD event and wherein, responsive to the enable signal, the cascaded switch closes and establishes a coupling between the first power supply rail and the second power supply rail of the IC;
    wherein providing a cascaded switch includes:
        implementing the first gate and the second gate of the cascaded switch as at least one dual-gated metal oxide semiconductor field effect transistor (MOSFET) device;
        implementing the drain as a single drain of the dual-gated MOSFET device;
        implementing the source as a single source of the dual-gated MOSFET device; and
        implementing the channel as a single channel of the dual-gated MOSFET device.

9. The method of claim 8, wherein providing the cascaded switch comprises implementing the cascaded switch as a metal oxide semiconductor field effect transistor (MOSFET) device without drain ballasting.

10. The method of claim 9, wherein providing the cascaded switch comprises:
    implementing the MOSFET device as a plurality of parallel-connected MOSFET devices, wherein each of the plurality of parallel-connected MOSFET devices is implemented as a dual-gate MOSFET device without drain ballasting, and each of the parallel-connected MOSFET devices has a respective first gate, a respective second gate, a respective channel, a respective source, and a respective drain;
    implementing each respective drain as a single drain of one of the parallel-connected MOSFET devices;
    implementing each respective source as a single source of one of the parallel-connected MOSFET devices; and
    implementing each respective channel as a single channel of one of the parallel-connected MOSFET devices.

11. The method of claim 8, wherein providing the cascaded switch comprises separating the first gate and the second gate by a predetermined distance determined according to at least one of a reduced parameter or a reduced snap-back voltage of a parasitic bipolar transistor device associated with the cascaded switch, wherein the parameter and the snap-back voltage decrease as the predetermined distance increases.

12. The method of claim 8, wherein providing the cascaded switch comprises setting a length of the channel to a predetermined length according to at least one of a reduced parameter or a reduced snap-back voltage of a parasitic bipolar transistor device associated with the cascaded switch, wherein the parameter and the snap-back voltage decrease as the predetermined length increases.

13. The method of claim 8, wherein providing the cascaded switch comprises setting a length of at least one of the first gate or the second gate to a predetermined length determined according to an amount of current the cascaded switch is to conduct during the ESD event.

14. A computer program product, comprising:
- a computer-usable medium comprising computer-usable program code that, when executed by a computer, implements a system that protects an integrated circuit (IC) from electrostatic discharge (ESD) events, the computer-usable medium comprising:
- computer-usable program code that implements a sensing circuit that detects an occurrence of an ESD event on at least one of a first power supply rail or a second power supply rail of the IC and, in response, outputs an alert signal identifying the occurrence of the ESD event;
- computer-usable program code that implements a driver circuit that, responsive to receiving the alert signal, outputs an enable signal; and
- computer-usable program code that implements a cascaded switch comprising a first gate and a second gate adjacent to the first gate, wherein the first and second gates are disposed upon a channel located between a drain of the cascaded switch coupled to the first power supply rail and a source of the cascaded switch coupled to the second power supply rail, wherein each of the first and second gates receives the enable signal and wherein, responsive to the enable signal, the cascaded switch closes and establishes a coupling between the first power supply rail and the second power supply rail of the IC;
- wherein the code that implements a cascaded switch includes code that:
  - implements the first gate and the second gate of the cascaded switch as at least one dual-gated metal oxide semiconductor field effect transistor (MOSFET) device;
  - implements the drain as a single drain of the dual-gated MOSFET device;
  - implements the source as a single source of the dual-gated MOSFET device; and
  - implements the channel as a single channel of the dual-gated MOSFET device.

15. The computer program product of claim 14, wherein the computer-usable program code that implements the cascaded switch comprises computer-usable program code that implements the cascaded switch as a metal oxide semiconductor field effect transistor (MOSFET) device without drain ballasting.

16. The computer program product of claim 14, wherein the computer-usable program code that implements the cascaded switch comprises computer-usable program code that separates the first gate and the second gate by a predetermined distance determined according to at least one of a reduced parameter or a reduced snap-back voltage of a parasitic bipolar transistor device associated with the cascaded switch, wherein the parameter and the snap-back voltage decrease as the predetermined distance increases.

17. The computer program product of claim 14, wherein the computer-usable program code that implements the cascaded switch comprises computer-usable program code that sets a length of the channel to a predetermined length according to at least one of a reduced parameter or a reduced snap-back voltage of a parasitic bipolar transistor device associated with the cascaded switch, wherein the parameter and the snap-back voltage decrease as the predetermined length increases.

18. The computer program product of claim 14, wherein the computer-usable program code that implements the cascaded switch comprises computer-usable program code that sets a length of at least one of the first gate or the second gate to a predetermined length determined according to an amount of current the cascaded switch is to conduct during the ESD event.

* * * * *